United States Patent [19]

Germer

[11] Patent Number: 4,625,163
[45] Date of Patent: Nov. 25, 1986

[54] DISPLAY TEMPERATURE COMPENSATOR FOR ELECTRIC METER

[75] Inventor: Warren R. Germer, Dover, N.H.

[73] Assignee: General Electric Company, Schenectady, N.Y.

[21] Appl. No.: 599,744

[22] Filed: Apr. 12, 1984

[51] Int. Cl.$^4$ .............. G01R 11/64; H03H 3/04; G02F 1/13

[52] U.S. Cl. .............. 324/103 R; 323/369; 350/331 T

[58] Field of Search .............. 340/784, 713, 785, 786; 350/331 T; 323/366, 367, 369, 370, 907; 324/103 R, 116, 105; 330/143; 374/183; 368/242

[56] References Cited

U.S. PATENT DOCUMENTS 3,686,517  8/1972  Sexton, Jr. .......................... 323/369
3,921,162  11/1975  Fukai et al. .......................... 340/784
3,956,661  5/1976  Sakamoto et al. .................. 323/907

Primary Examiner—Ernest F. Karlsen
Assistant Examiner—Vinh P. Nguyen
Attorney, Agent, or Firm—Robert E. Brunson; Thomas R. Morrison

[57] ABSTRACT

A display temperature compensator employs the non linear temperature coefficient of resistance of a thermistor to non linearly vary the control voltages fed to a liquid crystal display. At low temperature, substantially the entire supply voltage is available to control the liquid crystal display segments. At higher temperatures, the thermistor contracts the range of control voltages fed to the display in order that non-selected display segments remain off. A thermistor is used which has a non linear temperature coefficient of resistance which, when combined with selected fixed resistance value, substantially compensates for the non linear threshold voltage of the liquid display.

3 Claims, 7 Drawing Figures

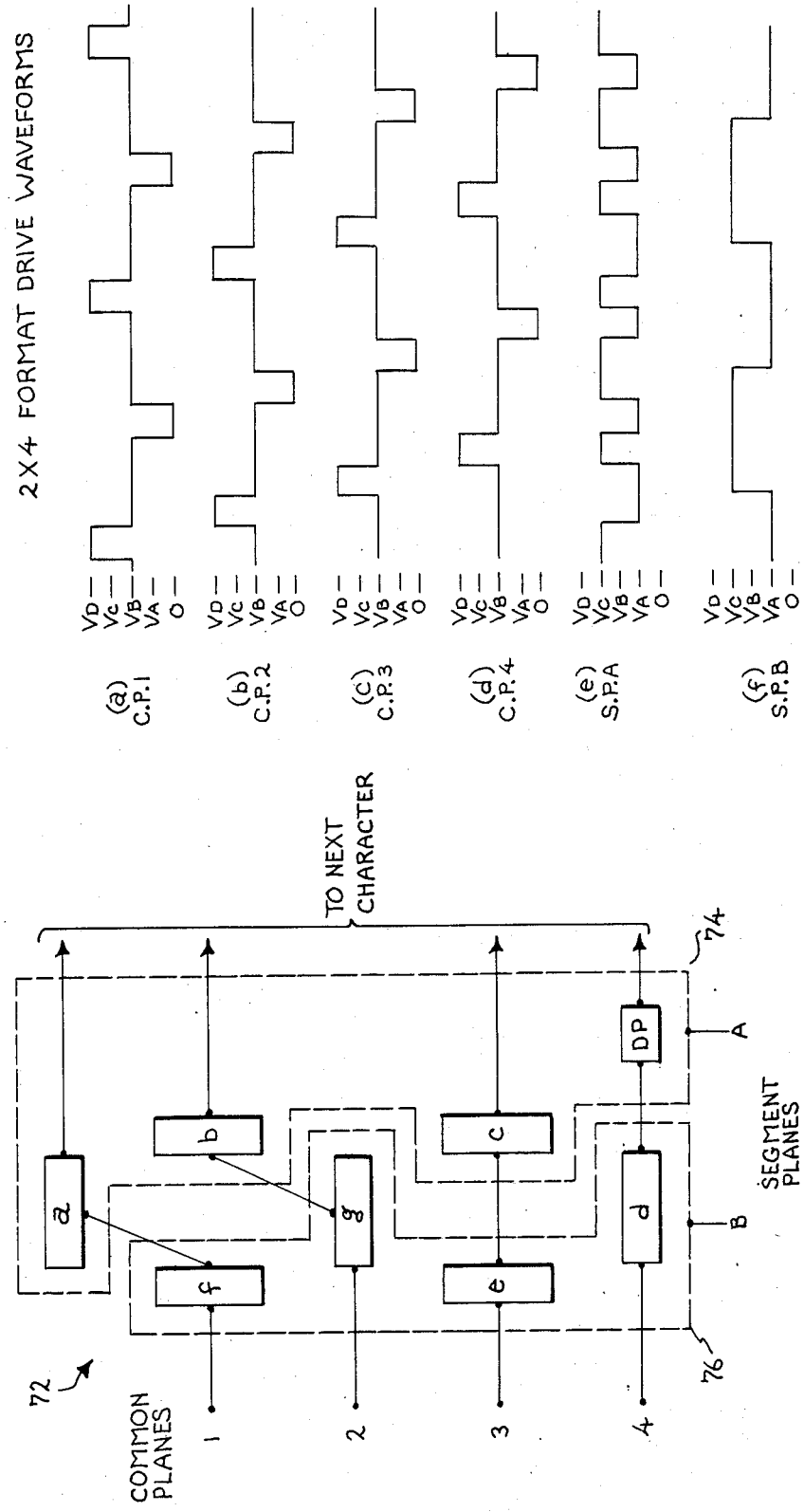

TEMPERATURE CHARACTERISTIC OF LCD DISPLAY

DISPLAY TEMPERATURE COMPENSATOR FOR ELECTRIC METER

BACKGROUND OF THE INVENTION

The present invention relates to electric meters and, more particularly, to display temperature compensators for electronic demand registers of electric meters.

Conventional electric meters employ an aluminum disk driven as a rotor of a small induction motor by an electric field at a speed which is proportional to the electric power being consumed by a load. Geared dials, or cyclometer discs, integrate the disk motion to indicate the total energy consumed, conventionally measured in kilowatt hours (one kilowatt hour equals one thousand watts of power consumption for one hour).

In addition to the above measurement of consumption, some electric meters contain means for separating the consumption into those parts of consumption occurring during peak and off-peak hours (however defined) and for recording maximum demand in any of a contiguous set of demand intervals during a predetermined period of time in order to adjust billing according to such parameters. In one such demand meter disclosed in U.S. Pat. No. 3,586,974, a mechanical demand register records the power usage during each demand interval over the predetermined period of time and stores the maximum value for reading. The predetermined period of time may be, for example, the time between meter readings, or a period of time corresponding to the billing period of the utility providing the power. A clockwork mechanism restarts the demand register at the ends of regular demand intervals of, for example, a fraction of an hour, so that, at the end of the predetermined period, the stored value represents the highest value of power usage occurring during any one of the regular demand intervals in the predetermined period.

Demand registers of the mechanical type, such as disclosed in the above U.S. Patent, have limited flexibility. Once their design is completed for a particular meter physical configuration, the design is not transferrable to a meter having a different physical configuration. In addition, the demand-measurement functions cannot be redefined without major mechanical redesign.

Greater flexibility may be obtainable using electronic acquisition, integration and processing of power usage. An electronic processor such as, for example, a microprocessor may be employed to manage the acquisition, storage, processing and display of the usage and demand data. U.S. Pat. Nos. 4,179,654; 4,197,582; 4,229,795; 4,283,772; 4,301,508; 4,361,872 and 4,368,519, among others, illustrate the flexibility that electronic processing brings to the power and energy usage measurement. Each of these electronic measurement devices includes means for producing an electronic signal having a characteristic such as, for example, a frequency or a pulse repetition rate, which is related to the rate of power usage. The electronic processor is substituted for the mechanical demand register of the prior art to keep track of the power usage during defined periods of time.

Electronic processors require some compatible means for displaying data to the energy consumer and/or to the meter reader. If the electronic processor is a digital processor, it is preferable to employ a display which is compatible with such digital processor. One such compatible display is a liquid crystal display (hereinafter LCD) in which a voltage impressed in a pattern across a liquid crystal fluid creates a corresponding pattern of transparent and opaque area which may be used to visually convey data.

One type of liquid crystal display employs multiplexed drive of a plurality of identical symbols in order to drastically reduce the number of external connections required. Multiplexed drive is accomplished using a plurality of common planes consisting of a first set of electrodes which are bussed to corresponding segments in all of the symbols and segment planes consisting of a second set of electrodes which are connected to the same selected ones of the segments in individual symbols. The intersections of the first and second sets of electrodes can be thought of as similar to the intersections of an X-Y grid. The desired pattern is created by selectively energizing ones of the first and second sets of electrodes in a repeating pattern effective to energize the particular display segments in the X-Y grid necessary to produce the desired pattern.

LCDs require that the voltage applied across their elements must exceed a predetermined threshold to turn them on and that the voltage must remain below the threshold to keep them off.

In order to prevent irreversible electrochemical action from destroying the display, the voltage at each segment must be symmetrically reversed so that the average DC component of voltage across each segment is close to zero such as, for example, less than about 50 millivolts. This is accomplished using a time division multiplex system having twice the number of time divisions as there are common planes. The voltage fed to the common planes and to the segment planes within one multiplex cycle are increased or decreased at the proper times within the multiplex cycle to energize each desired segment with a voltage exceeding the threshold voltage, first with one polarity and then equally with the opposite polarity. At other times, each segment receives an alternating voltage which is less than the threshold voltage in order to maintain such segment off until the next time it is scheduled to be turned on.

The voltage threshold defining the difference between the on and off states of an LCD segment changes non-linearly with temperature. As the temperature increases, for example, the threshold voltage decreases. Thus, application of a voltage across a segment which is small enough to avoid turn-on of the segment at a low temperature is too high to permit the segment to turn off at a higher temperature. For normal indoor applications where a room temperature in the range of from about 18 to about 25 degrees C. may be experienced, the change in threshold may be small enough to be tolerated without special compensation techniques. For greater temperature ranges, temperature compensation has been employed by approximating the change in threshold voltage by a linear change in the voltages applied to the display segments.

Displays used in electric meter service are exposed to a range of environmental parameters which exceed that encountered by most such apparatus. Electric meters may be exposed to direct desert sunlight and also to arctic temperatures. I have discovered that the linear approximations to temperature compensation employed in the prior art are not satisfactory to guarantee positive control of segment energization over the entire temperature range of an electric meter.

OBJECTS AND SUMMARY OF THE INVENTION

Accordingly, it is an object of the invention to provide an apparatus for temperature compensation of an LCD which overcomes the drawbacks of the prior art.

It is a further object of the invention to provide temperature compensation for a threshold voltage of an LCD which substantially tracks a non-linear temperature coefficient of the threshold voltage.

It is a further object of the invention to provide a temperature compensation for an LCD which employs the non linear temperature coefficient of resistance of a thermistor to contract the range of control voltages fed to the LCD at high temperatures in order to maintain an off voltage level which permits turning off selected segments of the LCD.

Briefly stated, the present invention provides a display temperature compensator which employs the non linear temperature coefficient of resistance of a thermistor to non linearly vary the control voltages fed to a liquid crystal display. At low temperature, substantially the entire supply voltage is available to control the liquid crystal display segments. At higher temperatures, the thermistor contracts the range of control voltages fed to the display in order that non-selected display segments remain off. A thermistor is used which has a non linear temperature coefficient of resistance which, when combined with selected fixed resistance values, substantially compensates for the non linear threshold voltage of the liquid display.

According to an embodiment of the invention, there is provided a temperature compensator for a liquid crysal display wherein the liquid crystal display employs combinations of at least three voltages switched thereto in a cyclic pattern for selectively energizing and deenergizing a plurality of display segments, the liquid crystal display having a threshold for energizing and deenergizing the display segments, the threshold being non linearly variable with temperature, comprising first voltage divider means between a substantially constant supply voltage and a reference voltage, the first voltage divider including a first resistor having a first terminal connected at a first junction to the supply voltage and a second terminal, a second resistor having a third terminal connected at a second junction to the second terminal and a fourth terminal, and at least a third resistor having a fifth terminal connected at a third junction to the fourth terminal and a sixth terminal connected to the reference voltage, a linear amplifying device connected between the third junction and the substantially constant supply voltage, the linear amplifying device being responsive to a control signal for controlling an amount of current through the third resistor and thus for controlling a voltage appearing at the third junction, a thermistor connected between the substantially constant supply voltage and a control element of the linear amplifying device, a fourth resistor connected between the control element and the reference voltage, a voltage divider formed by the thermistor and the fourth resistor being effective for producing the control signal, the thermistor having a non linear temperature coefficient of resistance and the non linear temperature coefficient of resistance and at least a resistance of the third and fourth resistors being related to each other in a relationship which controls a voltage at the third junction to a value which varies non linearly with temperature in a substantially constant relationship to the threshold over a substantial temperature range.

According to a feature of the invention, there is provided apparatus for multiplex control of a liquid crystal display of a type having at least two common planes and at least two segment planes, segments of the liquid crystal display being selectively energized and deenergized according to a voltage applied at the segments between the common and segment planes being greater than and less than a threshold voltage respectively, the threshold voltage being non linearly variable with temperature, a voltage divider between a supply voltage and a reference voltage, the voltage divider including at least first and second junctions, the first junction being nearer the reference voltage and the second junction being nearer the supply voltage, a dropping resistor between the first junction and the reference voltage, a plurality of analog switches selectively connected to the at least two common planes and the at least two segment planes, a first voltage at the first junction and a second at the second junction being connected to the analog switches, the analog switches being effective for selectively cyclically applying the first and second voltages to the segment and common planes in a pattern effective for sequentially selectively energizing and deenergizing the segments whereby a desired pattern of energized ones of the segments is produced, a transistor having its emitter-collector path connected between the second junction and the supply voltage, a voltage divider containing a thermistor and at least a second resistor connected between the supply voltage and the reference voltage, a third junction between the thermistor and the at least a second resistor being connected to a base of the transistor, the thermistor being of a type having a non linear temperature coefficient of resistance, the non linear temperature coefficient of resistance and a resistance of the at least a second resistor being related in a predetermined manner and the predetermined manner being effective for controlling a current through the first resistor to a value which is effective to maintain the first voltage in a substantially constant relationship to the threshold voltage over a substantial range of temperature.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 3 is a schematic diagram of a character of an LCD display.

FIG. 4 is a set of waveform diagrams to which reference will be made in explaining the operation of the character of FIG. 3.

DETAILED DESCRIPTION OF THE PREFERRED EMBODIMENT

Although the present invention may be adapted to any suitable style of electric meter which employs an element rotating at a speed proportional to power consumption, including single phase meters with one or more current windings and polyphase meters, for concreteness, the detailed description which follows is directed toward an illustrative example of a 2-wire single phase meter of the type having a single current coil and a single voltage coil.

Figure 1:
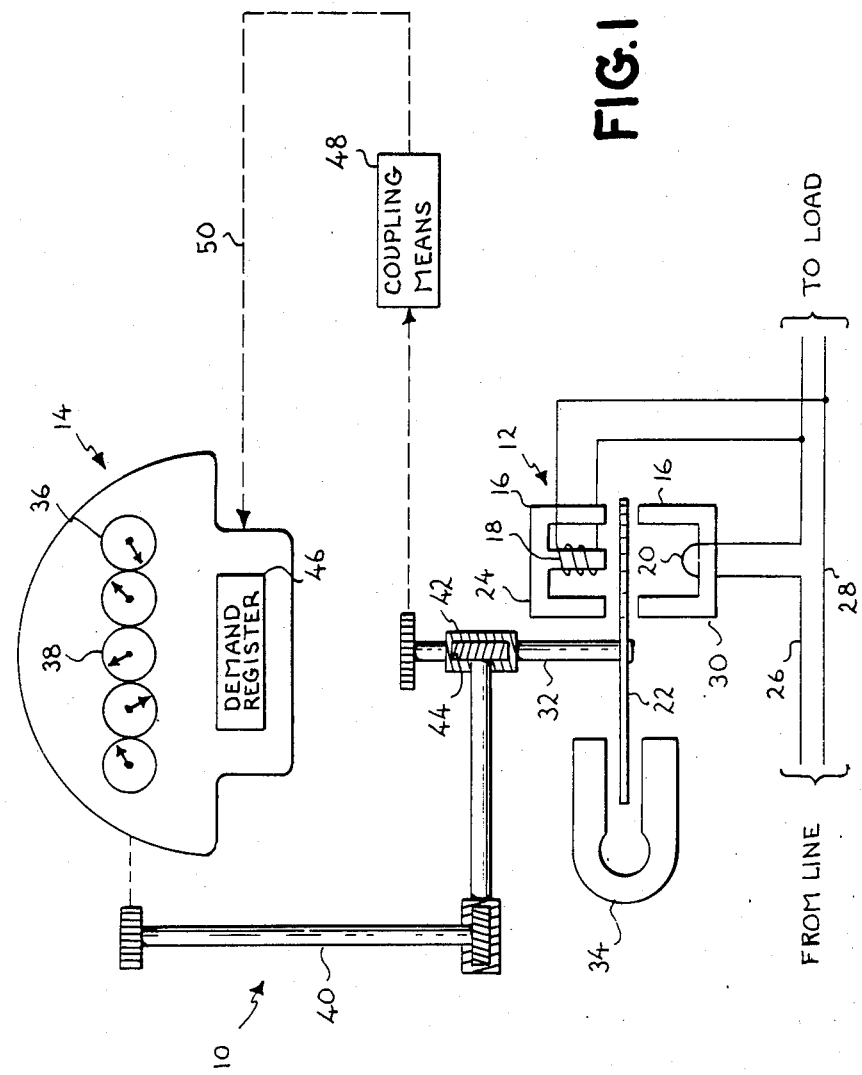
FIG. 1 is a schematic diagram of an electric meter to which the present invention may be applied.

Referring now to FIG. 1, there is shown, generally at 10, an electric meter which includes a small induction motor 12 driving a register 14. Induction motor 12 includes a stator 16 made up of a voltage coil 18 and a current coil 20 disposed on opposite sides of a disk 22. Voltage coil 18 employs a core 24 upon which is wound a large number of turns of fine wires. Voltage coil 18 is connected across lines 26 and 28 which feed power to a load (not shown). Current coil 20 employs a core 30 upon which a small number of turns, typically two or more, of heavy conductor are wound. Current coil 20 is connected in series with the power being fed to the load on line 26.

Disk 22 is affixed to a shaft 32 which is supported on suitable bearings (not shown) to permit concerted rotation of disk 22 and shaft 32 under the influence of a rotating magnetic field produced by the combined influence of voltage coil 18 and current coil 20. A permanent magnet 34, having its poles disposed on opposite sides of disk 22, applies a retarding force which is proportional to the rotational speed of disk 22. The rotational torque produced by voltage coil 18 and current coil 20 combined with the retarding torque produced by permanent magnet 34 is effective to rotate disk 22 at a speed which is proportional to the product of the voltage and the current; that is, the power consumed by the load.

Register 14 includes a watthour register 36 which may include, for example, a plurality of dials 38 which are suitably geared and driven by a suitable mechanical coupling 40 in proportion to the rotation of shaft 32. In the embodiment shown, mechanical coupling 40 includes a worm 42, which may be integrally formed in shaft 32, which engages and rotates a worm gear 44. Additional elements may be present in mechanical coupling 40 for coupling the rotation of worm gear 44 to watthour register 36 with or without change in speed and direction according to the design of the particular electric meter 10. As is conventional, watthour register 36 totals the number of revolutions of shaft 32, suitably scaled by the gear ratios employed, for billing purposes.

A demand register 46, shown schematically as a box in FIG. 1, is also connected by a suitable coupling means 48 to respond to the rotation of shaft 32. In the prior art, demand register 46 is conventionally a mechanical register having dials, or other indicating devices (not shown), and coupling means 48 is conventionally a mechanical arrangement including shafts and gearing driven by rotation of shaft 32. The dials, or indicating devices, in the mechanical embodiment of demand register 46 are urged forward for a fixed demand interval by a pusher mechanism (not shown). The pusher mechanism is reset and restarted at the end of each demand interval, leaving the indicating devices with an indication proportional to the power usage (the demand) during the demand interval. The indication on the indicating devices at any time is, therefore, the highest, or maximum, demand which has occurred during any of the demand intervals since the last time the indicating devices were reset. The recorded demand is employed in billing. In the present invention, demand register 46 is an electronic demand register.

Figure 2:
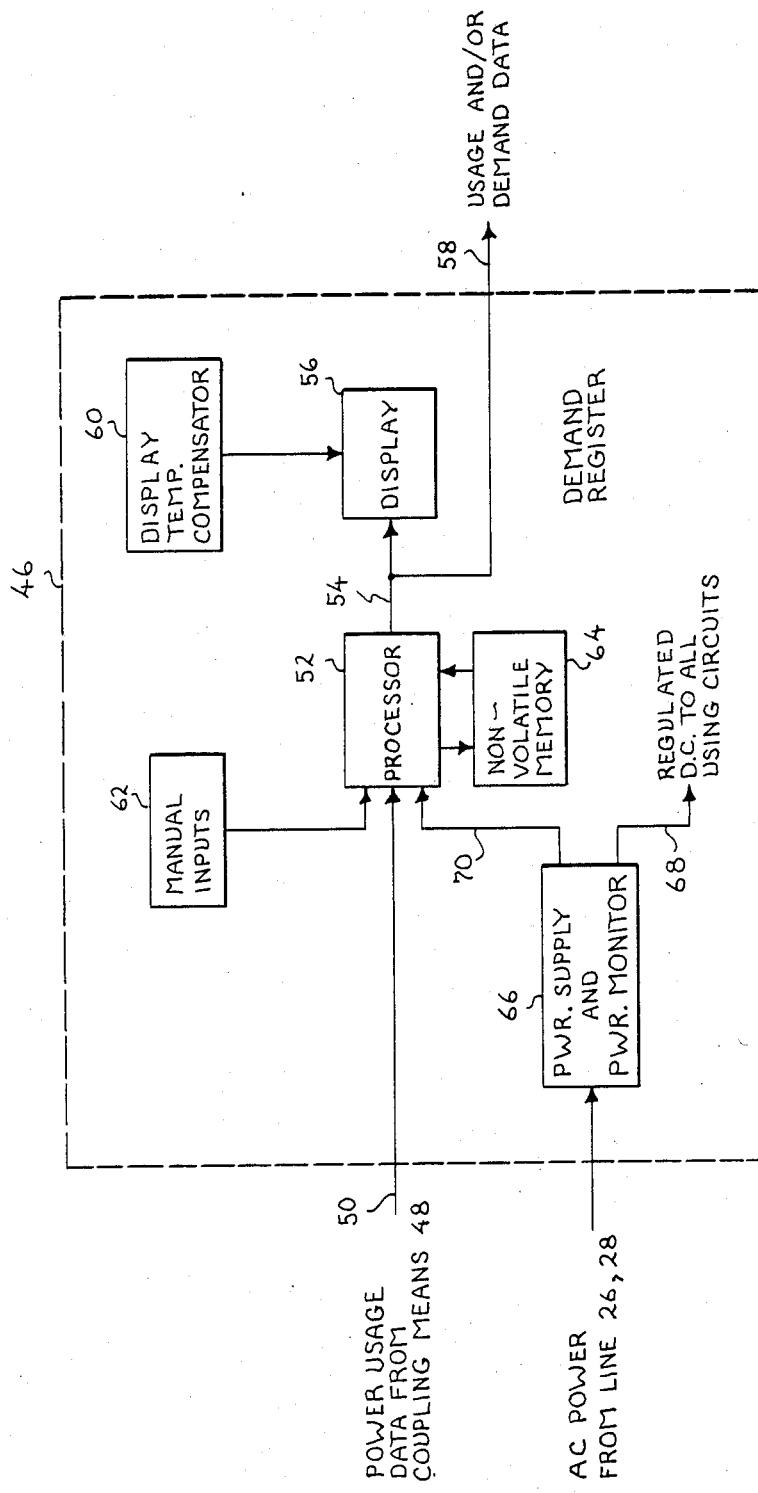
FIG. 2 is a block diagram of a demand register of FIG. 1 according to an embodiment of the invention.

Referring now to FIG. 2, there is shown, a simplified block diagram of a demand register 46 according to an embodiment of the invention. For present purposes, it is sufficient to note that the signal related to power usage fed from coupling means 48 to demand register 46 is an electronic signal having a characteristic such as, for example, a frequency, which is variable in dependence on the rate of power usage. Any suitable electronic signal generating apparatus, such as disclosed in the referenced prior patents, may be employed to produce a power usage signal which is applied on a line 50 to a processor 52 in demand register 46. Processor 52 appropriately performs calculations on the usage data to derive desired demand parameters and stores the result. In addition, processor 52 may provide an output on a line 54 suitable for driving a liquid crystal display 56. In addition, the stored data may be transmitted on a line 58 to a remote location (not shown) for further analysis and/or billing.

Due to the extremes of environment in which electric meters may be used, liquid crystal display 56 requires special compensation for environmental parameters. Such special compensation includes a display temperature compensator 60, which is the subject matter of the present disclosure and which is more fully detailed hereinafter.

The data which processor 52 transmits for display and/or the manner in which processor 52 operates on the input data to produce internally stored values may be modified according to a manual input 62 which is not of concern to the present disclosure.

As previously noted, processor 52 conventionally employs volatile random access memory elements which lose any data stored in them in the event of a power outage. This is usually not acceptable in an electric meter where such loss of usage and/or demand data has a negative financial impact on the utility supplying the electric power. Non-volatile storage elements such as, for example, electrically erasable programmable read only memory elements, are well known for use with processor 52. However, such non-volatile storage elements normally have relatively slow memory erase and write times on the order of 10 or 20 milliseconds. This is too slow for most applications. In addition to this drawback, the power required to write such memory elements is quite high compared to that required by volatile memory elements of processor 52. Finally, a wear-out mechanism in electrically erasable programmable read only memory cells limits the number of times they can be erased and re-recorded. About 10,000 cycles of write and erase brings such a memory element to the end of its reliable useful life. Memory elements in processor 52 must, of course, be written and erased many thousands of times a day. Thus, an electrically erasable programmable read only memory would have a very short life as the operating memory for processor 52. In its role in non-volatile memory 64, however, electrically erasable programmable read only memory elements are erased and rewritten only when a relatively serious power outage occurs and possibly during a relatively small number of test cycles. Such operations are not expected to occur on a frequent enough basis in the register of an electric meter to represent a limit on the life of the register.

In order to provide safe storage for data and/or programmed constants during a power outage, a conventional non-volatile memory 64 is provided into which such data and constants can be written in the event of a power outage and from which the data and constants can be again read upon restoration of normal conditions.

A power supply and power monitor 66 receives AC power from lines 26 and 28 for the production of a regulated DC voltage which is applied on a line 68 to all circuits in demand register 46 requiring such power. In addition to producing regulated DC power, power supply and power monitor 66 also monitors the condition of the AC power on lines 26 and 28 and, in response to certain detected conditions, applies control signals on a line 70 to processor 52 which controls the transfer of data from processor 52 to non-volatile memory 64 in the event of an apparent power outage and resets processor 52 in the event of an actual power outage.

The segment pattern in display 56 may include one or more of any conventional pattern such as, for example, a seven-segment numeric display, a seven-segment numeric display with decimal point, a seven-segment numeric display with decimal point and colon, a fourteen-segment alphanumeric pattern with or without a period/decimal point, or a matrix or other pattern now known or to become known. Corresponding segments of the patterns are bussed together in a conventional manner to receive multiplexed voltages from one of a plurality of common planes and sets of the segment planes in each pattern individually receive multiplexed voltages which apply voltage stresses between the common planes and the segment planes effective for individually controlling the on or off condition on any segment in display 56.

Although the specific segment pattern used in display 56 may influence the connections to the common and segment planes, such differences are not of interest to the present invention. Consequently, a single specific example shown in FIG. 3, to which reference is now made, has been selected for concreteness of description. A character 72, which is assumed to be one of a plurality of identical patterns, includes seven segments a–g laid out in a figure-8 pattern as well as a decimal point DP. Selective energization of segments a–g of character 72 permits forming a displayed character which may be any numeral 0-9 and several letters, for example, S, E and L.

As is conventional, an LCD includes a body of liquid crystal fluid sandwiched between two plane sheets of glass. Segments a–g and DP are conventionally conductive transparent elements of, for example, tin oxide, coated on the inside of the sheet of glass facing the viewer. Segments a–g and DP are selectively bussed together as shown and to corresponding segments of all other characters 72 in four common planes 1-4. That is, common plane 1 is connected to segments a and f in character 72 shown and to segments a and f in all other characters 72 in display 56. Similarly, common plane 2 is connected to segments b and g, common plane 3 is connected to segments c and e, and common plane 4 is connected to segments d and DP. A segment plane A 74, shown in dashed line, is coated onto the inner surface of the opposed plane sheet of glass forming a pattern opposed to segments a, b, c and DP. Similarly a segment plane B 76, also shown in dashed line, is coated onto the inner surface of the opposed plane sheet of glass forming a pattern opposed to segments d–g. If different voltages are applied to segment plane A 74 and segment plane B 76 than to one or more of the segments facing them, the differences in applied voltage are imposed across the liquid crystal fluid (not shown) filling the space between the front and back plane sheets of glass. If, for example, the voltage difference between common plane 1 and segment plane A 74 exceeds the threshold for energizing a segment and the voltages on common planes 2-4 differ from the voltage on segment plane A 74 by less than the threshold voltage for the particular liquid crystal fluid used under the existing temperature, then segment a is turned on and segments b–g and DP remain off. It would be clear to one skilled in the art that a cyclic pattern of voltage waveforms can be created which permits any combination of segments a–g and DP to be individually controlled.

The waveforms shown in FIG. 4, for example, are effective to display a numeral 4 on character 72. Numeral 4 requires energization of segments b, c, f and g and deenergization of all other segments. The following combination of common and segment planes must produce energizing voltage across the liquid crystal fluid:

| SEGMENT | COMMON PLANE | SEGMENT PLANE |
| --- | --- | --- |
| b | 2 | A |
| c | 3 | A |
| f | 1 | B |
| g | 2 | B |

The waveforms applied to the common planes varies from a central positive value VB to a maximum positive value VD and from the central positive value VB to a minimum positive value, which may be zero. The waveforms applied to the segment planes, on the contrary, vary only between a more positive value VC intermediate VB and VD and a less positive value VA intermediate VB and O. The voltages are established at values whose differences exceed the threshold for turning on a segment only when a common-plane voltage is at its most positive VD (or negative O) at the same time that the segment plane voltage is at its most negative VA (or most positive VC) and are below the threshold at all other times.

Figure 5:
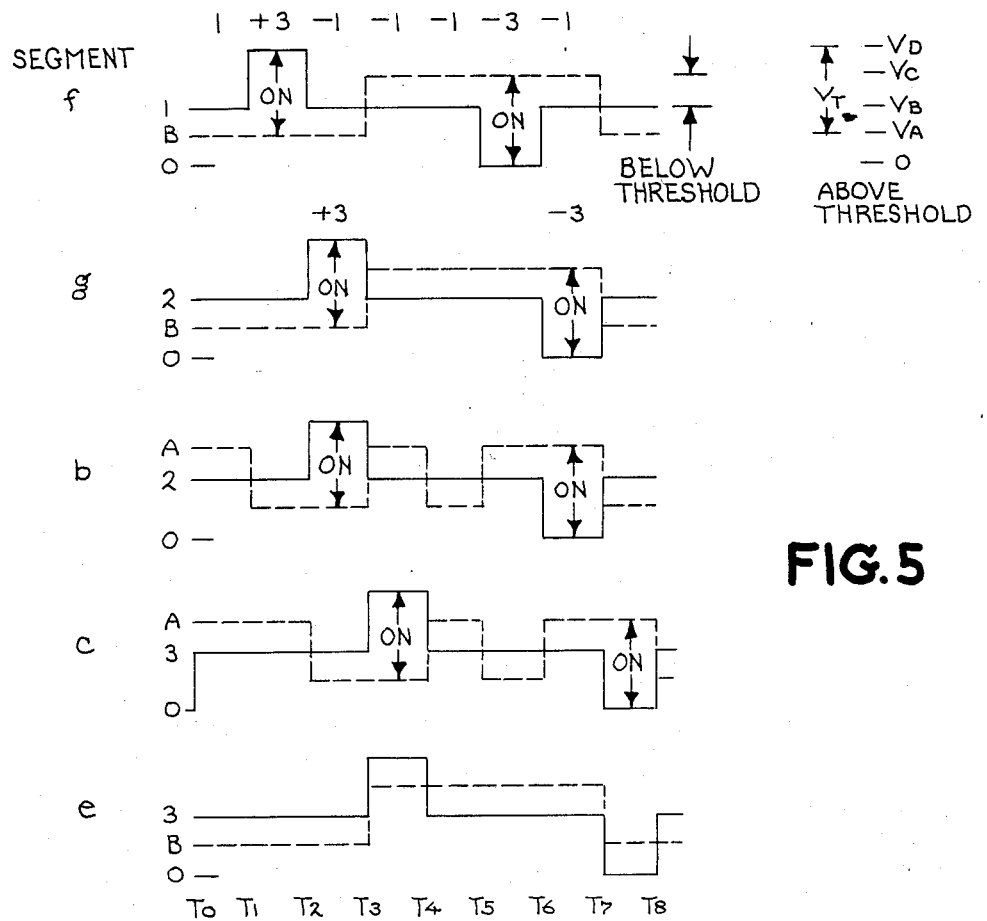
FIG. 5 is a set of waveform diagrams with the voltages fed to common and segment planes of selected segments of the character of FIG. 3 superimposed.

Referring now to FIG. 5, the relevent common-plane and segment-plane voltages are shown superimposed for energized segments b, c, f and g as well as for segment e which remains deenergized. Between times T1 and T2, common-plane 1 voltage applied to segment f is VD while segment-plane voltage B, also applied to segment f, is VA. The voltage difference applied to segment f at this time is $VT = VD - VA$ which exceeds the threshold for turning segment f on. Between times T2 and T3, the voltage across segment f is only $VB - VA$. This voltage is insufficient to energize segment f. Between times T3 and T5, although the polarity of the voltage across segment f is reversed from its prior polarity, the difference, $VC - VB$ remains below the threshold and segment f remains off. Between times T5 and T6, the voltages of the common and segment planes attached to segment f are at their opposite maxima and segment f is again energized.

A similar recital can be made illustrating the energization of segments b, c, and g to create a numeral 4. In contrast, segment e is never exposed to segment-plane and common-plane voltages of opposite maxima. The illustrated common-plane waveform 3, combined with the segment-plane waveform B applied to segment e always exhibit a difference which remains below the threshold.

One skilled in the art would recognize from the preceding description that, for proper operation of character 72, the voltage differences VC−VB and VB−VA must remain below the energization threshold in order for the selected segments to remain off and that the voltage differences VD−VA and $VC-O=VC$ must be above the energization threshold.

Figure 6:
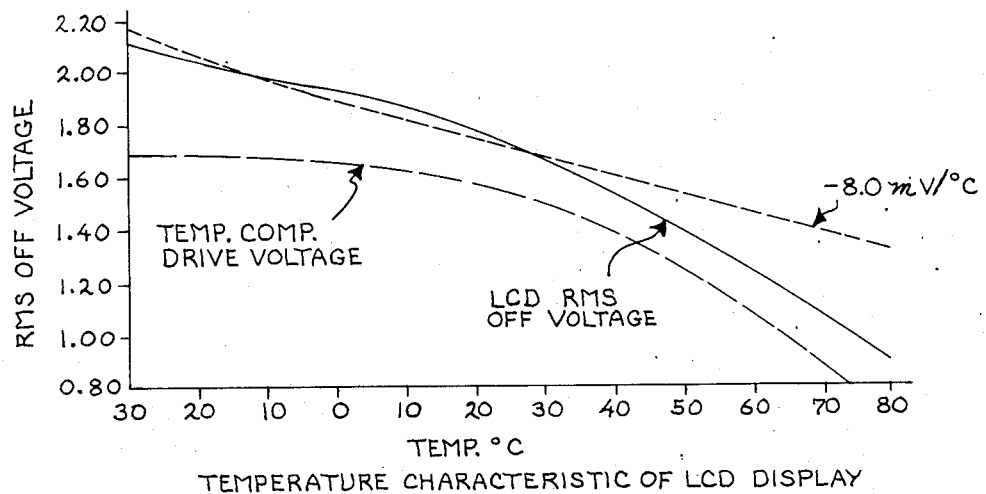
FIG. 6 is a set of curves showing the non linear temperature characteristic of the threshold voltage of an LCD display.

Referring now to FIG. 6, there is shown, in solid line, the manner in which the threshold voltage varies with temperature. At low temperatures, character 72 requires a relatively high voltage for energization. As the temperature increases, the threshold voltage decreases. If the same voltages are provided at both high and low temperatures, an off voltage which is low enough to extinguish, or leave the segments deenergized, at low temperature may be so high that non-selected segments may remain energized at high temperature. This may reduce the useful contrast of character 72 at high temperature or may even make character 72 inoperative.

The threshold voltage curve is seen to be substantially non linear, particularly at higher temperatures. Over a range of temperatures up to about 30 degrees C., the threshold voltage curve can be reasonably approximated by a straight line such as, for example, the dashed line shown in FIG. 6. For one type of liquid crystal fluid, a slope of about −8 millivolts per degree C. makes an adequate fit to the low-temperature portion of the curve. Prior art systems have used such a linear approximation in providing temperature compensation for LCDs. At temperatures exceeding about 30 degrees C., however, the linear approximation (dashed line) diverges substantially from the actual threshold (solid line) due to the non linearity of the threshold line. The extremes of temperature encountered in electric meter service, require temperature compensation that more nearly follow the non linear curve of the threshold. If the off voltage, i.e. VC−VB or VB−VA, could be maintained at values shown in dot-dash line in FIG. 6, then whenever a segment is non-selected, it would remain fully extinguished.

Figure 7:
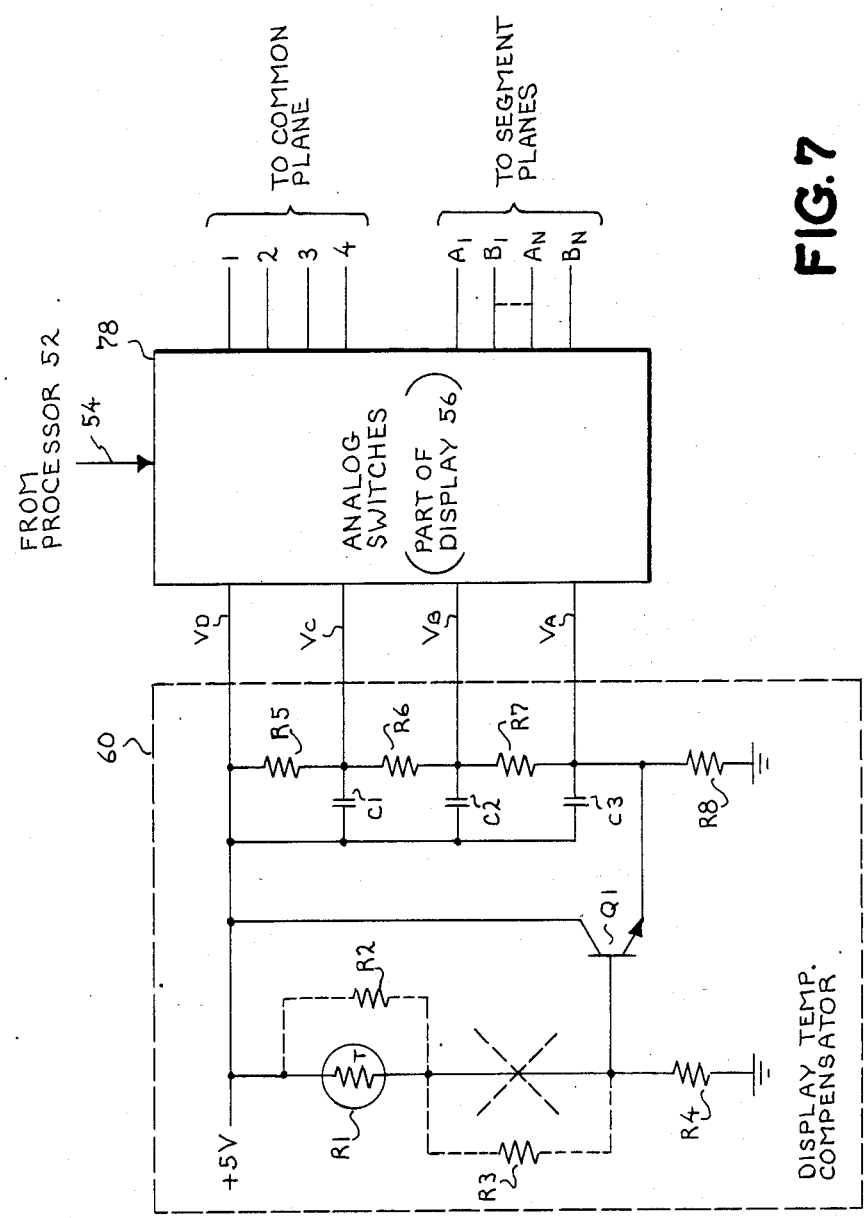
FIG. 7 is a schematic and block diagram of a display temperature compensator and analog switches according to an embodiment of the invention.

Referring now to FIG. 7, a set of analog switches 78 at the input of display 56 receive control signals on line 54 from processor 52 for selectively gating voltages VD, VC, VB, VA received from display temperature compensator 60 to the common and segment planes of display 56 as previously described. The required waveforms for energization of specific segments are included in the signals on line 54. Analog switches 78 are conventional devices of any convenient type such as, for example, solid state analog switches. Analog switches 78 may be, for example, of a type included as part of a display driver of a conventional microprocessor such as, for example, a type 7503 microprocessor manufactured by NEC. Thus, in order to control the on and off voltages applied to characters 72, the voltages fed to analog switches 78 from display temperature compensator 60 must be appropriately compensated for temperature.

A resistive voltage divider consisting of resistors R5, R6, R7 and R8 is connected between a regulated positive supply and ground. The positive supply voltage is taken as VD. Voltage VC is developed at the junction of resisters R5 and R6. Voltage VB is developed at the junction of resistors R6 and R7. Voltage VA is developed at the junction of resistors R7 and R8. A transistor Q1 is connected with its emitter-collector path from the positive supply to the junction of resistors R7 and R8. A temperature-sensitive voltage divider consisting of a thermistor R1 and a resistor R4 is connected between the positive supply and ground. Resistors R2 and R3 should be ignored for the moment. The voltage developed at the junction of thermistor R1 and resistor R4 is applied to the base of transistor Q1.

As is well known, a conducting transistor maintains a substantially constant voltage drop between its emitter and its base. In a silicon transistor this voltage drop is on the order of about 0.65 volts. In order to maintain this substantially constant emitter-base voltage drop, transistor Q1 permits more or less current to flow through its emitter-collector path. This current, passing through resistor R8, controls the voltage VA. The remainder of the voltage divider, consisting of resistors R5, R6 and R7, scale the voltage difference VD−VA according to the ratios of their resistances to produce the remaining two voltages VB and VC. Thus, all of the voltages fed to analog switches 78 are mutually related with differences which are controlled by the resistance relationship of thermistor R1 and resistor R4.

The value of resistor R8 is preferably a small fraction of the values of resistances R5-R7. At low temperature, the resistance of thermistor R1 is very high. Thus the current through transistor Q1 and the resulting voltage drop across resistor R8 is very small. Consequently, substantially the entire positive supply voltage is available to analog switches 78. As the temperature increases, the resistance of thermistor R1 decreases. This causes more current to flow through transistor Q1 and thus more voltage drop across resistor R8. This reduces the range of voltage applied to analog switches 78.

It turns out that the temperature coefficient of some thermistors is non linear. Selecting a thermistor with a properly shaped non linearity, and selecting appropriate values for resistors R4 and R8, can produce the non linear off voltage curve shown in dot-dash line in FIG. 6. In the preferred embodiment, Thermistor R1 is a type RL29E1, resistor R4 is 13 kilohms, resistor R8 is 4.7 kilohms and resistors R5, R6 and R7 are 100 kilohms.

The shape of the off voltage curve may be modified by the optional addition of one or both of appropriately valued resistors R2 in parallel with thermistor R1 and resistor R3 in series with thermistor R1. If series resistor R3 is employed, the line between thermistor R1 and the base of transistor Q1 must be broken as indicated by the dashed X.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A temperature compensator for a liquid crystal display, wherein said liquid crystal display employs combinations of at least three voltages switched thereto in a cyclic pattern for selectively energizing and deenergizing a plurality of display segments, said liquid crystal display having a threshold for energizing and deenergizing said display segments, said threshold being non linearly variable with temperature, comprising:

a first voltage divider between a substantially constant supply voltage and a reference voltage;

said first voltage divider including a first resistor having a first terminal connected at a first junction to said supply voltage and a second terminal, a second resistor having a third terminal connected at a second junction to said second terminal and a fourth terminal, terminal, and at least a third resistor having a fifth terminal connected at a third junction to said fourth terminal and a sixth terminal connected to said reference voltage;

a linear amplifying device connected between said third junction and said substantially constant supply voltage, said linear amplifying device being responsive to a control signal for controlling an amount of current through said third resistor and thus for controlling a voltage appearing at said third junction;

a thermistor connected between said substantially constant supply voltage and a control element of said linear amplifying device;

a fourth resistor connected between said control element and said reference voltage, a second voltage divider formed by said thermistor and said fourth resistor being effective for producing said control signal;

said thermistor having a non linear temperature coefficient of resistance;

said non linear temperature coefficient of resistance and and at least a resistance of said third and fourth resistors having a relationship which controls a voltage at said third junction to a value which varies non linearly with temperature in a substantially constant relationship to said threshold over a substantial temperature range;

said substantially constant supply voltage being said first voltage;

a voltage at said second junction being said second voltage;

a voltage at said third junction being said third voltage;

a voltage difference between said substantially constant supply voltage and said third voltage being established by a current in said third resistor; and a ratio between said first, second and third voltages being scaled by resistances of said first and second resistors.

2. A temperature compensator according to claim 1 wherein said linear amplifying device is a transistor and said control element is a base of said transistor.

3. Apparatus for multiplex control of a liquid crystal display of a type having at least two common planes and at least two segment planes, segments of said liquid crystal display being selectively energized and deenergized according to whether a voltage applied to said segments between said common and segment planes is greater than and less than a threshold voltage respectively, said threshold voltage being non linearly variable with temperature comprising:

a first voltage divider between a supply voltage and a reference voltage;

said first voltage divider including at least first and second junctions, said first junction being nearer said reference voltage and said second junction being nearer said supply voltage;

a dropping resistor between said first junction and said reference voltage;

a plurality of analog switches selectively connected to said at least two common planes and said at least two segment planes;

a first voltage at said first junction and a second voltage at said second junction being connected to said analog switches, said analog switches being effective for selectively cyclically applying said supply voltage and said first and second voltages to said segment and common planes in a pattern effective for sequentially selectively energizing and deenergizing said segments whereby a desired pattern of energized ones of said segments is produced;

a transistor having its emitter-collector path connected between said second junction and said supply voltage;

a second voltage divider containing a thermistor and at least a second resistor connected between said supply voltage and said reference voltage;

a third junction between said thermistor and said at least a second resistor being connected to a base of said transistor;

said thermistor being of a type having a non linear temperature coefficient of resistance;

said non linear temperature coefficient of resistance and a resistance of said at least a second resistor being related in a predetermined manner;

said predetermined manner being effective for controlling a current through said first resistor to a value which is effective to maintain said first voltage in a substantially constant relationship to said threshold voltage over a substantial range of temperature;

a voltage difference between said supply voltage and said second voltage being established by a current in said at least a second resistor; and a ratio between said supply voltage and said second and third voltages being scaled by resistances in said first voltage divider.

* * * * *